(12) United States Patent
Hein

(10) Patent No.: US 11,894,844 B1
(45) Date of Patent: Feb. 6, 2024

(54) RAPID DATA TRANSFER SENSOR ARRAYS

(71) Applicant: Allegro MicroSystems, LLC, Manchester, NH (US)

(72) Inventor: Matthew Hein, Dallas, TX (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 17/816,511

(22) Filed: Aug. 1, 2022

(51) Int. Cl.
| | |
|---|---|
| H03K 19/00 | (2006.01) |
| H03K 19/17736 | (2020.01) |
| G06F 13/42 | (2006.01) |
| H03K 19/17784 | (2020.01) |

(52) U.S. Cl.
CPC ..... *H03K 19/17744* (2013.01); *G06F 13/4247* (2013.01); *H03K 19/1774* (2013.01); *H03K 19/17784* (2013.01)

(58) Field of Classification Search
CPC ............ G06F 13/4247; H03K 19/1774; H03K 19/17744; H03K 19/17784
See application file for complete search history.

(56) References Cited

U.S. PATENT DOCUMENTS

| | | | |
|---|---|---|---|
| 7,091,876 B2 | 8/2006 | Steger | |
| 7,436,217 B2 * | 10/2008 | Lewko | G06F 1/10 326/46 |
| 8,008,908 B2 | 8/2011 | Doogue et al. | |
| 8,122,159 B2 * | 2/2012 | Monreal | G06F 13/37 710/9 |
| 8,222,888 B2 | 7/2012 | David et al. | |
| 8,446,146 B2 | 5/2013 | Foletto et al. | |
| 8,598,867 B2 | 12/2013 | Foletto et al. | |
| 8,686,720 B2 | 4/2014 | Foletto et al. | |
| 8,723,512 B1 | 5/2014 | Burdette et al. | |
| 8,729,890 B2 | 5/2014 | Donovan et al. | |
| 8,793,085 B2 | 7/2014 | Donovan et al. | |
| 8,890,518 B2 | 11/2014 | Daubert | |

(Continued)

FOREIGN PATENT DOCUMENTS

EP      1490772      12/2004

OTHER PUBLICATIONS

U.S. Appl. No. 17/805,070, filed Jun. 2, 2022, Myers et al.

(Continued)

*Primary Examiner* — Kurtis R Bahr
(74) *Attorney, Agent, or Firm* — DALY, CROWLEY, MOFFORD & DURKEE, LLP

(57) ABSTRACT

Rapid-data-transfer sensor arrays include a controller and a plurality of sensor integrated circuits (ICs) connected in series and configured to periodically take measurements and provide measurement data to the controller as serial data. A sensor IC includes a transducer, a shift register, a serial-data-in (SDI) pin, a serial-data-out (SDO) pin, a clock pin, and a bi-directional start/done (ST/DN) pin. The sensor IC includes a power regulation circuit configured to selectively supply power for a sleep mode and an active mode for recording data and an internal shift register. When finished with the measurement, the sensor IC is configured to provide measurement data to the shift register for transfer to the controller. The controller is configured to initiate serial transfer of data from each of the shift registers of the first plurality of sensor ICs to the controller. Examples include a 2D array.

45 Claims, 11 Drawing Sheets

(56) References Cited

U.S. PATENT DOCUMENTS

| | | | |
|---|---|---|---|
| 8,957,676 | B2 | 2/2015 | David et al. |
| 9,140,536 | B2 | 9/2015 | Foletto et al. |
| 9,329,057 | B2 | 5/2016 | Foletto et al. |
| 9,395,391 | B2 | 7/2016 | Fernandez et al. |
| 9,552,315 | B2 * | 1/2017 | Monreal ............. G06F 13/4068 |
| 9,739,846 | B2 | 8/2017 | Petrie et al. |
| 9,739,847 | B1 | 8/2017 | Alpago et al. |
| 9,739,848 | B1 | 8/2017 | Alpago et al. |
| 9,780,706 | B2 | 10/2017 | Allegrini et al. |
| 9,804,249 | B2 | 10/2017 | Petrie et al. |
| 10,056,364 | B1 | 8/2018 | Klebanov et al. |
| 10,088,533 | B2 | 10/2018 | Rivas et al. |
| 10,270,428 | B1 | 4/2019 | Geisler et al. |
| 10,348,223 | B1 | 7/2019 | Khosravi et al. |
| 10,481,220 | B2 | 11/2019 | Alpago et al. |
| 10,557,873 | B2 | 2/2020 | Latham |
| 10,608,430 | B2 | 3/2020 | Lamar et al. |
| 10,747,708 | B2 | 8/2020 | Kozomora et al. |
| 10,845,434 | B2 | 11/2020 | Fernandez et al. |
| 11,009,565 | B2 | 5/2021 | Fernandez et al. |
| 11,055,165 | B2 | 7/2021 | Rigoni et al. |
| 11,327,127 | B2 | 5/2022 | Lassalle-Balier et al. |
| 2007/0198139 | A1 * | 8/2007 | Boran ................ G05B 19/0423 701/1 |
| 2021/0091692 | A1 | 3/2021 | Lu |

OTHER PUBLICATIONS

U.S. Appl. No. 17/816,758, filed Aug. 2, 2022, Hein.
Ishtiaque Amin and James Lockridge, "Daisy Chain Implementation for Serial Peripheral Interface;" Texas Instruments Application Report, published Aug. 2018 (revised Apr. 2021), pp. 1-11; 11 pages.

* cited by examiner

RAPID DATA TRANSFER SENSOR ARRAYS

BACKGROUND

Sensor arrays with multiple sensors operate to take sensor measurements over a distributed area. Numerous types of sensors can be used in arrays and sensor arrays can be used in many various applications. Examples include imaging arrays for digital cameras, photodetector arrays for automotive lidar systems, arrays of magnetic field sensors for monitoring circuit elements or moving magnetic targets, temperature sensor arrays for monitoring temperatures over a distributed area, as well as many others.

Existing sensor arrays typically operate in a system by having a sensor in the array provide interrupts to a system controller based on a sensor reading exceeding a set threshold. For such systems, however, the system controller typically must read back the data from each sensor by commanding a serial read or performing an ADC conversion for the sensor. The system controller must perform such a data read on all of the sensors in the array in order to determine the output of the sensor array.

When reading or "scanning" measurement data from multiple sensors in such sensor arrays, it is often a system design requirement for the system controller to read the data from the multiple sensors within a short time. Such a design constraint typically requires sensor arrays systems to employ significant computational power, e.g., high-speed processors capable of many million instructions per second (MIPS), and system resources like high-speed analog-to-digital-converters (ADCs). Both approaches drive up system complexity and cost and can introduce issues related to high-clock speeds, e.g., transient signals, phase noise, and jitter.

SUMMARY

An aspect of the present disclosure includes a rapid-data-transfer sensor array. The sensor array can include a controller configured to receive serial data; and a first plurality of sensor integrated circuits (ICs) connected in series and configured to periodically take measurements and provide measurement data to the controller as serial data. Each sensor IC (a.k.a., sensor device) can include a transducer or sensor, a shift register, a serial-data-in (SDI) pin, a serial-data-out (SDO) pin, a bi-directional start/done (ST/DN) pin, a power regulation circuit configured to selectively supply power for a sleep mode and an active mode, and a clock pin for receiving a clock signal from the controller. Each sensor IC can be configured for operation in the sleep mode in which the transducer can be inactive and the active mode in which a measurement can be performed with the transducer and resulting data recorded/stored. The bi-directional ST/DN pin can be configured to activate the sensor IC from the sleep mode in which the ST/DN pin is in a high state into the active mode in which the ST/DN pin can be in a low state for the measurement. The sensor IC can be configured to pull the bi-directional ST/DN pin to the low state when performing the measurement and to release the bi-directional ST/DN pin and enter the sleep mode after finishing the measurement. When finished with a measurement, the sensor IC can be configured to provide measurement data to the shift register for transfer to the controller. The controller can be configured to provide a clock signal on the clock pin to initiate serial transfer of data from each of the shift registers of the first plurality of sensor ICs to the respective SDO pins for data transfer to the controller.

Implementations may include one or more of the following features. The controller can be connected to the bi-directional ST/DN pin of each of the first plurality of sensor ICs by a first ST/DN line configured with a pull-up resistor. The first ST/DN line can be connected to a general-purpose input/output (GPIO) pin of the controller, which is utilized or configured as a ST/DN pin. The ST/DN (GPIO) pin can be configured as either an output pin pulling low or an input pin, where the pin is neither pulling low or high. In the sleep mode, for each sensor IC the shift register can be active. Each of the sensor ICs can include an internal pull-down open drain switch configured to pull the bi-directional ST/DN pin to the low state while the sensor IC is in the active mode. The sensor ICs can be connected in a serial daisy chain configuration. Each sensor IC can be configured to store measurement data in the shift register in response to a transition on the ST/DN pin from the low state to the high state. Each sensor IC can be configured to receive serial data provided at the SDI pin and, when a clock signal is received on the clock line from the controller, store the data in the shift register. The power regulation circuit of each sensor IC may include an internal timer configured to wake the sensor IC from the sleep mode based on a timing provided by the timer. The timer can be programmable. The first plurality of sensor ICs may include one or more magnetic field sensors. The one or more magnetic field sensors may include one or more Hall effect elements. The one or more magnetic field sensors may include one or more magnetoresistance elements. The first plurality of sensor ICs may include one or more temperature sensors. The first plurality of sensor ICs may include one or more current sensors. The first plurality of sensor ICs may include one or more voltage sensors. The first plurality of sensor ICs may include one or more analog-to-digital converters (ADCs), where each ADC can be coupled to a transducer disposed exterior to the respective sensor IC.

The sensor array can include a second plurality of sensor ICs connected in series and configured to periodically take measurements and provide measurement data to the controller as serial data. Each sensor IC in the second plurality of sensor ICs can include a transducer, a shift register, a serial-data-in pin, a serial-data-out pin, a bi-directional ST/DN pin, a power regulation circuit configured to selectively supply power for a sleep mode and an active mode. The controller can be configured to provide a clock signal on the clock pin to initiate serial transfer of data from each of the shift registers of the second plurality of sensor ICs. The controller can be connected to the bi-directional ST/DN pin of each of the second plurality of sensor ICs by a second ST/DN line configured with a pull-up resistor. The controller can be configured to activate one of the sensor ICs from the sleep mode to the active mode by sending a polling signal on the ST/DN line. Each sensor IC can further be configured to, when a sensor measurement threshold is exceeded, to pull the ST/DN pin to the low state for a fixed amount of time before releasing the ST/DN pin and entering the sleep mode. The controller may include a microcontroller. The controller may include a digital signal processor (DSP). The controller may include a field programmable gate array (FPGA). Each of the first plurality of IC sensors can be configured to receive serial data on the SDI pin from a connected IC sensor. Implementations may include hardware, a method or process, or computer software on a computer-accessible medium.

Another aspect includes a method of collecting data from a rapid data transfer sensor array. The method can include configuring a plurality of sensor integrated circuits (ICs) to produce output data in a serial format in a serial-data-out (SDO) configuration, where the plurality of sensor ICs may be connected in series. The method can include connecting a start/done (ST/DN) line from a controller to the plurality of sensor ICs, where each sensor IC can be configured to pull the ST/DN line from a high state in a sleep mode to a low state in an active mode for sensor measurement. The method can include waking a first sensor IC from a sleep mode to the active mode for sensor measurement, where the ST/DN line can be pulled to the low state when the sensor IC can be in the active mode.

The method can include performing a sensor measurement with the first sensor IC in the active mode, where the first sensor releases the ST/DN line from the low state when the sensor measurement can be finished. In response to completion of the sensor measurement by the first sensor IC, measurement data can be shifted to a shift register of the first sensor IC and transitioning the first sensor IC to the sleep mode. In response to the ST/DN line being pulled to the low state, the rest of plurality of sensor ICs can be activated into the active mode for respective sensor measurements. In response to completion of the respective sensor measurements of the rest of the plurality of sensor ICs, measurement data can be transferred to respective shift registers of the sensor ICs and the rest of sensor ICs can be transitioned to the sleep mode. The method can include causing the ST/DN line to transition to the high state in response to the last of the plurality of sensor ICs finishing the respective sensor measurement and releasing the ST/DN line from the low state. In response to the ST/DN line transitioning to the high state, the controller can send a clock signal to the plurality of sensor ICs to initiate data transfer. In response to the plurality of sensor ICs receiving the clock signal, data can be transferred in serial format from the shift registers of the plurality of sensor ICs to the controller. Other examples and embodiments can include corresponding computer systems, apparatus, and computer programs recorded on one or more computer storage devices, each configured to perform the actions of the methods.

Implementations may include one or more of the following features. The data can be transferred while the plurality of sensor ICs are in the sleep mode. The plurality of sensor ICs may include magnetic field sensing elements. The magnetic field sensing elements may include one or more hall effect elements. The magnetic field sensing elements may include one or more magnetoresistance elements. The plurality of sensor ICs may include one or more temperature sensors. The plurality of sensor ICs may include one or more current sensors. The plurality of sensor ICs may include one or more voltage sensors. The plurality of sensor ICs may include one or more analog-to-digital converters (ADC), where each SDC can be coupled to a transducer disposed exterior to the respective sensor IC. Waking a first sensor IC from a sleep mode to the active mode may include the controller pulling the ST/DN line to the low state. Waking a first sensor IC from a sleep mode to the active mode may include an activation of the sensor IC by an internal timer. Implementations of the described techniques may include hardware, a method or process, or computer software on a computer-accessible medium.

A further aspect includes a rapid-data-transfer sensor array. The rapid-data-transfer sensor array can include a first plurality of sensor integrated circuits (ICs) connected in series and configured to periodically take measurements and provide measurement data to a data line as serial data. Each sensor IC may include a transducer, a shift register, a serial-data-in (SDI) pin, a serial-data-out (SDO) pin, a bi-directional start/done (ST/DN) pin, a power regulation circuit configured to selectively supply power for a sleep mode and an active mode, and a clock pin for receiving a clock signal from a clock line. Each sensor IC can be configured for operation in the sleep mode in which the transducer is unused and the active mode in which a measurement can be performed with the transducer. The bi-directional ST/DN pin can be configured to activate the sensor IC from the sleep mode in which the ST/DN pin is in a high state into the active mode in which the ST/DN pin is in a low state for the measurement. The sensor IC can be configured to pull the bi-directional ST/DN pin to the low state when performing the measurement and to release the bi-directional ST/DN pin and enter the sleep mode after finishing the measurement. When finished with the measurement, the sensor IC can be configured to provide measurement data to the shift register for transfer to the data line. The clock pin can be configured to provide a clock signal to initiate serial transfer of data from each of the shift registers of the first plurality of sensor ICs to the respective SDO pins for data transfer to the data line. Other embodiments of this aspect include corresponding computer systems, apparatus, and computer programs recorded on one or more computer storage devices, each configured to perform the actions of the methods.

Implementations may include one or more of the following features. The sensor ICs of the first plurality of sensor ICs can be connected at the respective bi-directional ST/DN pin by a first ST/DN line configured with a pull-up resistor. In the sleep mode, for each sensor IC the shift register can be active. Each of the sensor ICs can include an internal pull-down open drain switch configured to pull the bi-directional ST/DN pin to the low state while the sensor IC is in the active mode. The sensor ICs can be connected in a serial daisy chain configuration. Each sensor IC can be configured to store measurement data in the shift register in response to a transition on the ST/DN pin from the low state to the high state. Each sensor IC can be configured to receive serial data provided at the SDI pin and store the data in the shift register. The power regulation circuit of each sensor IC can include an internal timer configured to wake from the sleep mode based on a timing provided by the timer. The first plurality of sensor ICs can be configured for connection to a microcontroller having a GPIO pin, an SDI pin, and a clock pin. The microcontroller can be configured to control the bi-directional ST/DN line with the GPIO pin, receive serial data at the SDI pin from the first plurality of sensor ICs over the data line, and to provide a clock signal to the first plurality of sensor ICs on the clock pin. Implementations may include hardware, a method or process, or computer software on a computer-accessible medium.

A system of one or more computers can be configured to perform particular operations or actions, e.g., as described herein for various examples, by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the present disclosure, which is susceptible of many embodiments. What follows is illustrative, but not exhaustive, of the scope of the present disclosure.

BRIEF DESCRIPTION OF THE DRAWINGS

The manner and process of making and using the disclosed embodiments may be appreciated by reference to the figures of the accompanying drawings. In the figures like reference characters refer to like components, parts, elements, or steps/actions; however, similar components, parts, elements, and steps/actions may be referenced by different reference characters in different figures. It should be appreciated that the components and structures illustrated in the figures are not necessarily to scale, emphasis instead being placed upon illustrating the principals of the concepts described herein. Furthermore, embodiments are illustrated by way of example and not limitation in the figures, in which.

DETAILED DESCRIPTION

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the inventive subject matter. The subject technology is susceptible of many embodiments. What follows is illustrative, but not exhaustive, of the scope of the subject technology.

Prior to describing examples and embodiments of the present disclosure some information is provided for context.

In typical prior art sensor devices, the sensor output can be provided as an analog or PWM output. Alternatively, a SPI or I2C interface device can be used, but the sensor data is typically read back on demand by the system controller. Existing serial interfaces (SPI, I2C) require overhead for addressing and read/write operation. Such prior sensor devices may in some cases allow for rapid scan times of many sensors in a sensor array but only at the cost of very significant hardware requirements, e.g., through use of a very large MCU with many ADC resources, multiple channels to read sensors, multiplexors on the board to switch signals, etc.

For prior art sensor arrays, when reading or "scanning" measurement data from multiple sensors, it is often a system design requirement for the system controller to read the data from the multiple sensors within a short time. Such a design constraint typically requires sensor arrays systems to employ significant computational power, e.g., high-speed processors capable of many million instructions per second (MIPS), and system resources like high-speed analog-to-digital-converters (ADCs). Both approaches drive up system complexity and cost and can introduce issues related to high-clock speeds, e.g., transient signals, phase noise, and jitter.

In contrast with prior art sensor arrays, examples and embodiments of the present disclosure can utilize sensor interrupts to a microcontroller with an architecture to trigger other sensors devices in a grouping in order to quickly gather sensor data. Once data is available, a serial interface can allow rapid serial data output to the system controller. Examples and embodiments of the present disclosure can provide methods/systems/circuitry to stream data from a sensor array to a microcontroller without requiring the overhead of addressing multiple chip-select lines. Examples and embodiments of the present disclosure can replace such "scanning" techniques in multi-sensor systems, where each sensor device in an array is addressed individually by a system controller, by providing a sensor interrupt configuration/architecture that can allow for simpler system hardware and firmware in order to read data quickly from a large number of sensors.

Figure 1:
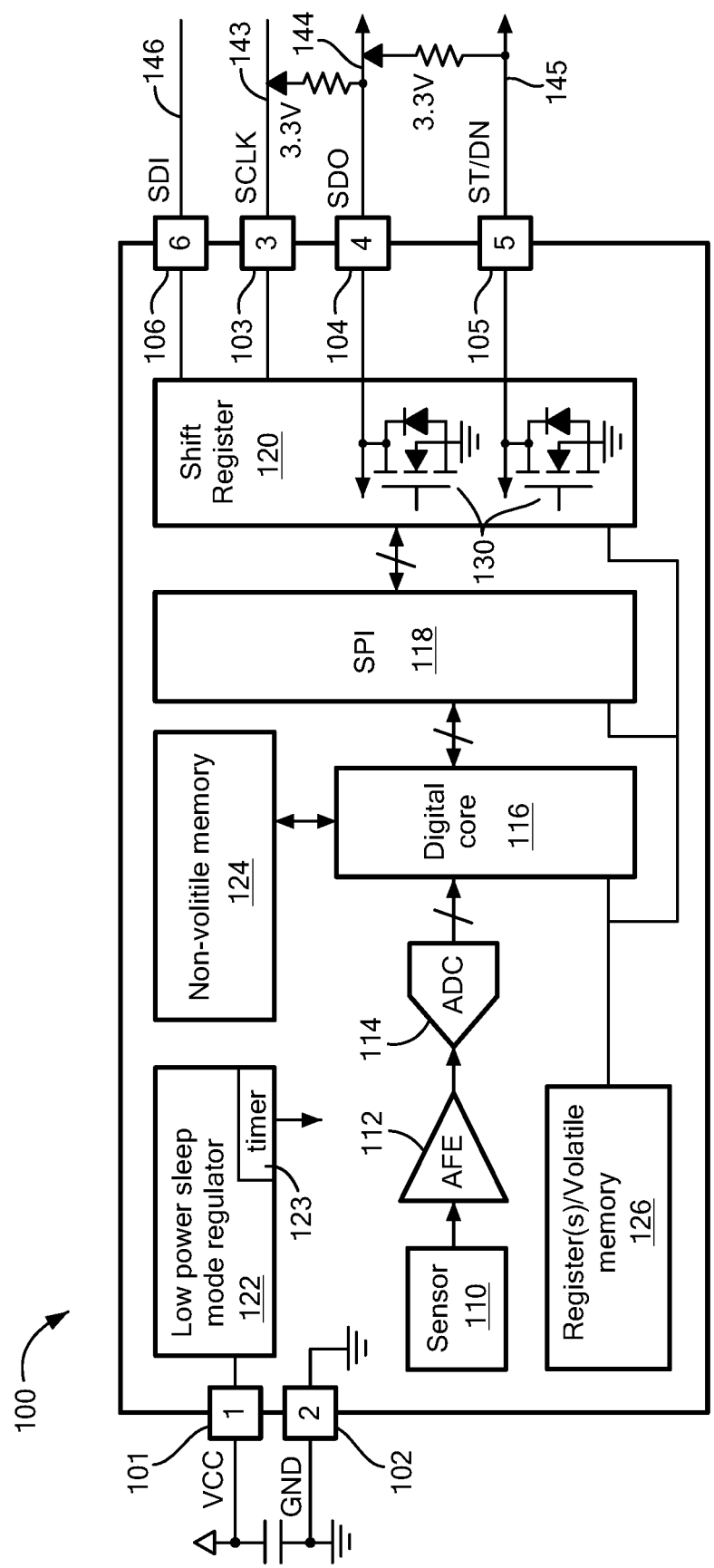
FIG. 1 is a block diagram of an example sensor integrated circuit, in accordance with the present disclosure.

FIG. 1 is a block diagram of an example sensor integrated circuit (IC) 100, in accordance with the present disclosure. Sensor IC 100 can be configurable for multiple modes of operation, including a low-power sleep mode, an active mode, and a serial-data-out mode for rapid data transfer.

The sensor IC (sensor device) 100 can include a transducer or sensor 110, analog front end (AFE) 112, and an analog-to-digital converter (ADC) 114. Sensor 110 can include any type of sensor and may include multiple sensors; examples include, but are not limited to, magnetic field sensors such as Hall effect sensors and magnetoresistance sensors, temperature sensors, photodiodes, pressure and/or force sensors, accelerometers, and the like. Sensor IC 100 can include digital core 116, e.g., a processor, shift register 120, power regulator 122, non-volatile memory 124, and volatile memory 126. An SPI interface 118 connects digital core 116 to shift register 120. Power regulator 122 can selectively apply power to certain components of sensor IC 100 for a low-power or sleep state of operation, as described in further detail below. Connections/pins are present to supply power, e.g., $V_{CC}$ 101 and ground 102. Sensor IC 100 can include a serial-data-out (SDO) pin 104 and a serial-data-in (SDI) pin 106. SDO line 104 may be connected to SDO line 144, which may be connected to an external device. SDI pin 106 may be connected to SDI line 146, which may also be connected to an external device, e.g., another sensor device, a controller, etc. Sensor IC 100 also includes a bidirectional start/done (ST/DN) pin 105, described in further detail below. Open drain circuitry (switches) 130 are shown for the SDO pin 104 and ST/DN pin 105. ST/DN pin 105 may be connected to ST/DN line 145, e.g., which may be connected to a controller (not shown) and/or other sensor ICs similar to sensor IC 100.

As noted above, the sensor IC 100 is operational to enter into a low-power (sleep) mode. Regulator 122 provides the ability to enter into and out of the low-power sleep mode, e.g., by reducing or eliminating power supplied to all or some of the components of the system 100 except for the shift register 120 (and internal timer 123, when present). Power regulator circuit 122 enables system power savings because the sensor does not have to be ON at all times. Internal timer 123 can periodically wake up the sensor IC 100, e.g., to automatically take a measurement at a particular time. In examples, sensor IC 100 can wake up, perform a measurement, and then go back into sleep mode automatically, e.g., at a rate configured by the end user by a non-volatile memory setting. The end-user may set or program the sleep timer 123, which sets the rate at which the sensor device 100 automatically enters and exits sleep mode. In some examples, e.g., used with controller-initiated polling of the sensor IC 100, internal timer 123 may be omitted.

Bidirectional ST/DN pin 105 can be used as both an input and output for the sensor device 100. ST/DN pin 105 can be used to wake up the device 100 from sleep mode on a falling edge, e.g., from a pulldown event on ST/DN line 145. When the ST/DN pin 105 is pulled low—e.g., by an external source such as a controller, or by the IC sensor 100 itself— the transition to the low state signals the sensor IC 100 to wake up from low-power sleep mode and begin a sensor measurement. When the sensor IC 100 is woken up by an ST/DN pin falling edge on the ST/DN line 145 connected to ST/DN pin 105, the sensor IC will enable its own pulldown on the ST/DN pin 105, which will hold the ST/DN line 145 low, until the measurement process has completed. ST/DN pin 105 can be connected to an internal pull-down open drain switch 130 to pull the ST/DN pin 105 low as long as the sensor IC 100 is in an active mode of operation (performing measurements, recording data, etc.).

Once the measurement process is finished, the sensor device 100 releases its pulldown on the ST/DN pin 105. In the absence of any external source pulling down on the ST/DN line 145, the ST/DN line 145 will transition to a high state. The transition (rising edge) to the high state of the ST/DN line 145 informs the controller (e.g., host MCU) that the measurement process has completed. In example embodiments, a rising edge on the ST/DN line can also internally command the sensor IC 100 to store the resultant data into the output shift register 120 and begin low-power sleep mode entry.

The serial (SPI) interface 118 can allow configuration of the sensor IC 100 through read and write operations to access device registers, e.g., register(s) 126. Sensor IC 100 can be configured to operate in one of multiple modes. For example, sensor IC 100 can be configured to operate in a default mode allowing operation of the sensor IC 100 with bidirectional SPI with read & write instructions. Sensor IC 100 may additionally or alternatively be configured to operate in a serial data out (SDO) mode, e.g., by a user or designer setting specific non-volatile memory settings through SPI writes to the device. Once configured into serial data out (SDO) mode, sensor IC 100 will store resultant data into shift register 120 to be read out by a system controller (not shown). In some examples, once rapid serial data out (SDO) mode is entered, the sensor IC may be unable to accept SPI writes (instructions).

Memory 124 can be used to configure the sensor 100 into serial data out (SDO) mode, e.g., from a default operational mode (bidirectional SPI with read & write). Non-volatile memory 124 can also be used to configure/program the (optional) sleep mode timer 123, and/or the sensor threshold for interrupt, which sets at what measured value the sensor triggers an interrupt on the ST/DN line. Any suitable type of non-volatile memory may be used for memory 124; examples can include, but are not limited to, EEPROM, FLASH, and/or one-time programmable (OTP) memory, or the like.

When configured into rapid serial data out (SDO) mode, the sensor device 100 will output data through shift register 120 when commanded to perform a measurement. The data can be stored in the shift register 120 on a rising edge of the ST/DN pin and can be clocked out to the system controller on command. Shift register 120 can operate in both active mode and low-power sleep mode of the sensor device 100. The data output can include a digitized N-bit value (e.g., N-bit digital word) corresponding to the sensor measurement(s), e.g., magnetic field strength (flux density), temperature, current, or other data.

Figure 2:
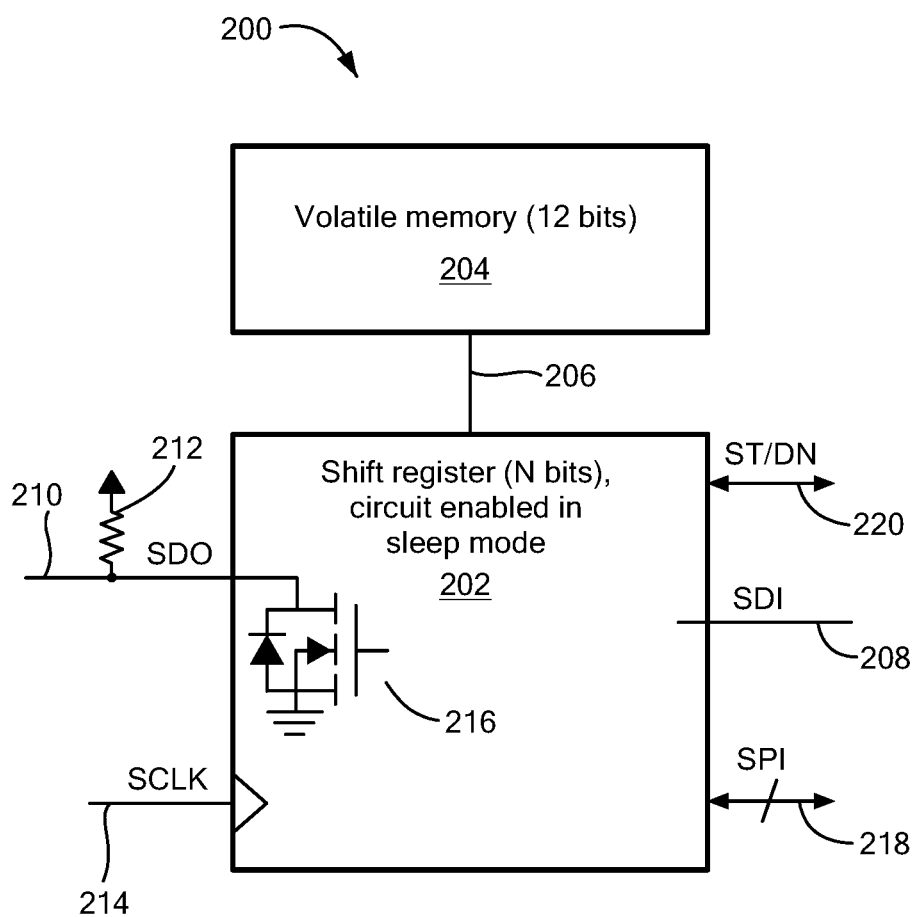
FIG. 2 is a block diagram of example shift register circuitry, in accordance with the present disclosure.

FIG. 2 is a block diagram of example shift register circuitry 200, in accordance with the present disclosure. Circuitry 200 includes shift register 202 connected to volatile memory 204, e.g., by parallel connection 206. Shift register 202 has a serial-data-in (SDI) line (port) 208 and a serial-data-out (SDO) line (port) 210. SDO line 208 can have a pull-up resister 212, as shown. Shift register 202 also has a system clock input (SCLK) 214. Open drain circuitry (switch) 216 is shown for the SDO line 210. Shift register 202 can include an SPI line 218 and ST/DN line 220, as shown. Shift register 202 may be of any suitable size, e.g., 16 bits, 12 bits, 8 bits, etc.

Shift register 202 can be active while the related sensor IC, e.g., sensor IC 100 of FIG. 1, is in a low-power or sleep mode, allowing a related system controller (e.g., 310 of FIG. 3A) to clock out or retrieve data by applying a clock signal to the SCLK pin 214 of shift register 202. On the rising edge of the clock signal provided to SCLK pin 214, the data can be shifted out (on SDO line 210 of register 202) by one bit. A rising edge on ST/DN line 220 can trigger loading of data into the shift register 202 from the volatile memory 204, prior to the related sensor IC (e.g., sensor IC 100 of FIG. 1) entering sleep mode.

Figure 3A:
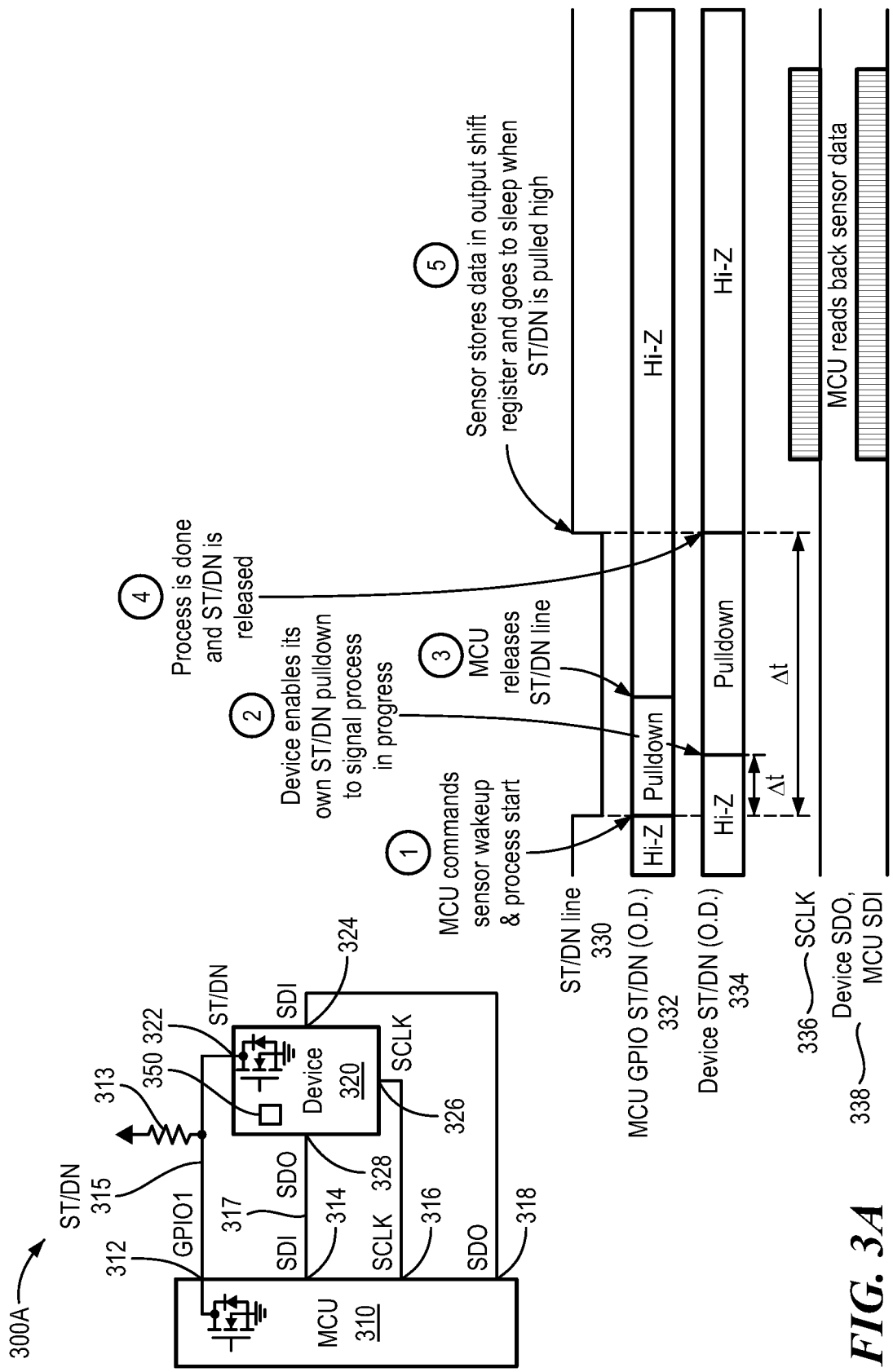
FIGS. 3A-B are block diagrams of an example controller and sensor circuit configured for sensor-initiated polling and automatic polling, respectively, in accordance with the present disclosure.
Figure 3B:
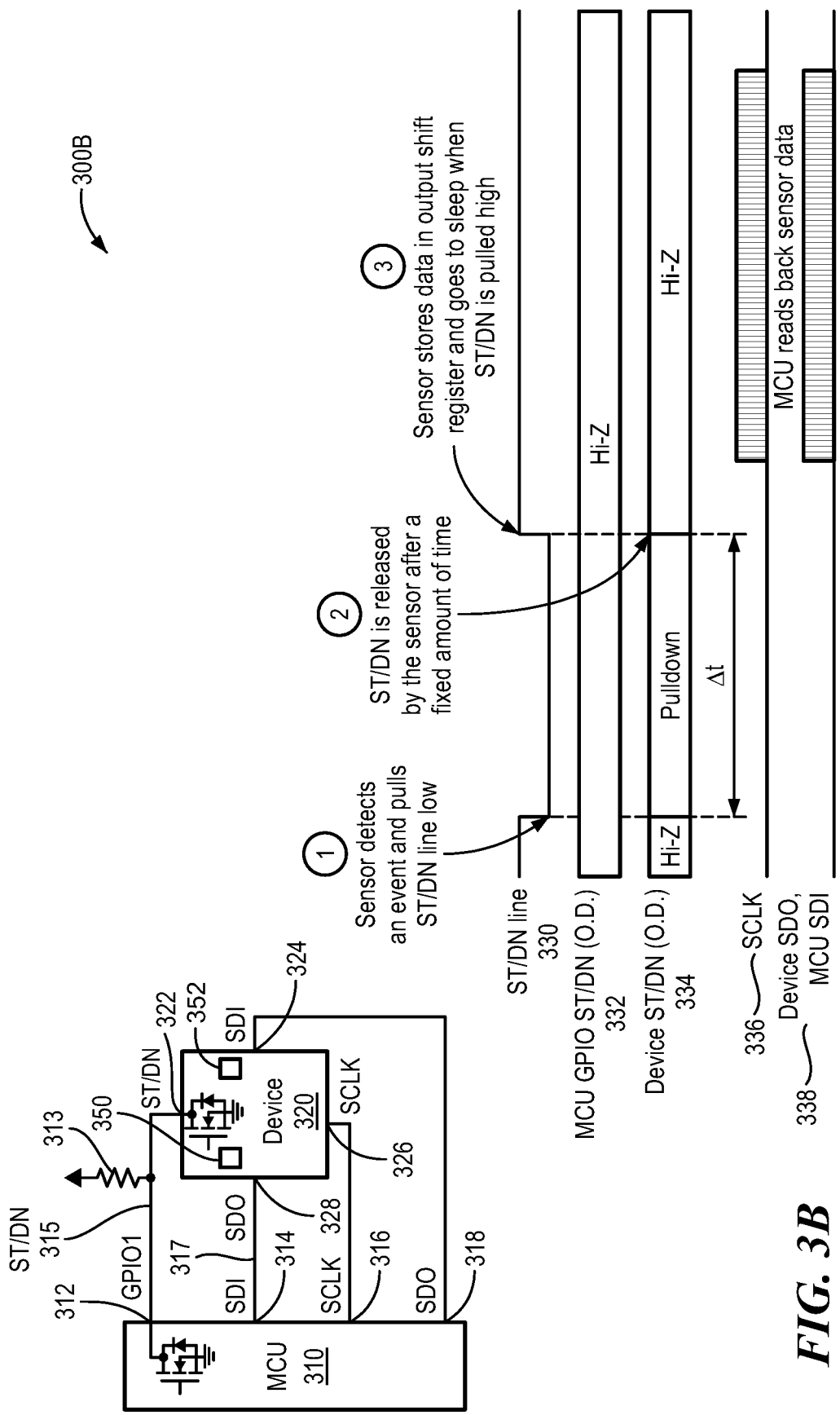

FIGS. 3A-B are diagrams of an example controller and sensor circuit 300 configured for controller-initiated polling and automatic polling, respectively, in accordance with the present disclosure. FIGS. 3A-B include timing diagrams for the respective configurations of circuit 300.

Referring to FIG. 3A, circuit 300 includes a controller 310, e.g., a microcontroller unit or MCU acting as a host controller, and a sensor IC (sensor device) 320. Sensor IC 320 can include any type of suitable sensor or transducer. Controller 310 includes a pin, e.g., general-purpose input-output (GPIO) pin or chip-select (nCS) pin, utilized or configured as a start/done (ST/DN) pin 312. Controller 310 also includes a serial-data-in (SDI) pin 314, a system clock (SCLK) pin, and a serial-data-out (SDO) pin 318.

Sensor IC 320 includes ST/DN pin 322, SDI pin 324, SCLK pin 326, SDO pin 328, and output shift register 350. Pullup resistor 313 is configured on ST/DN line 315, which is shown connecting MCU ST/DN pin 312 and sensor IC ST/DN pin 322. Serial data line 317 is shown connecting the sensor IC SDO pin 328 and MCU SDI pin 314. In operation of sensor IC 320, the ST/DN pin 322 acts as a bidirectional input and output. States of the ST/DN line 330, MCU ST/DN pin 332, sensor IC ST/DN pin 334, SCLK pin 336, and serial data line 338 (corresponding to serial data line 317 connecting sensor IC SDO pin 328 and MCU SDI pin 314) are shown for events 1-5.

As shown in FIG. 3A, when controller 310 and sensor IC 320 are configured for controller-initiated (a.k.a., manual) polling of the sensor IC 320, the controller 310 sends a signal on ST/DN line 315 to pull the ST/DN pin 322 low. The state of ST/DN line 315 is shown at 330. The state of the controller ST/DN pin 312 is shown at 332 (where "O.D." indicates open-drain). When the ST/DN pin 322 is pulled low (event 1), the sensor device 320 is signaled to wake up from the low-power sleep mode and begin a sensor measurement. While the sensor 320 is performing the measurement, the sensor IC 320 enables its own pulldown on the ST/DN pin 322 (event 2). The state of the IC sensor ST/DN pin 322 is shown at 334. The ST/DN pin 322 pulldown will hold the ST/DN line 315 low—even after the external source (e.g., controller 310) has released the external pulldown on the ST/DN line 315 (event 3)—until the sensor measurement process has completed (event 4). Once the sensor measurement process is completed, the ST/DN line 315 is released by the sensor IC 320. Release of the ST/DN line 315 causes a rising edge (event 5) on the ST/DN line 315, which informs controller 310 that the sensor measurement process has completed. The rising edge on the ST/DN line 315 (event 5) can also be used to command/trigger the sensor IC 320 to store the resultant data into its output shift register (e.g., shift register 120 in FIG. 1) and then enter into low-power sleep mode to conserve power. The state of the controller clock (SCLK) pin is shown at 336 while the state of the serial data line 317 (connecting the IC sensor SDO pin 328 to the controller SDI pin 314) is shown at 338.

In FIG. 3B, controller 310 and sensor IC 320 are configured for automatic (sensor initiated) polling of the sensor IC 320. In the configuration shown, sensor IC 320 includes an internal timer 352 that is configured to wake the sensor IC 320 at one or more predetermined times, e.g., on a set or variable schedule. In this configuration, when a sensor IC 320 takes a measurement that exceeds a preset threshold, it notifies the controller 310 that it has sensor data to provide by pulling down on the ST/DN pin. For example, while the sensor IC 320 performs an automatic measurement, e.g., upon waking at a time specified by its internal timer 352, it may record a measurement that exceeds a programmed or configured measurement threshold. In the event a sensor measurement threshold is exceeded, the sensor device 320 can enable its own pulldown on the ST/DN pin 322 (event 1) for a fixed (e.g., programmable) amount of time before releasing the pulldown on the ST/DN line (event 2). The sensor device 320 can then enter a sleep mode (event 3). The state of ST/DN line 315 is shown at 330 and the state of the controller ST/DN pin 312 is shown at 332. The state of the IC sensor ST/DN pin 322 is shown at 334. A rising edge on the ST/DN line 315 (event 3) can also command the sensor IC 320 to store the resultant data into internal shift register 350. The state of the controller clock (SCLK) pin is shown at 336 and the state of the serial data line 317 is shown at 338. As shown, in the automatic polling configuration, the state of the controller ST/DN pin 312 remains high during events 1-3.

Figure 4:
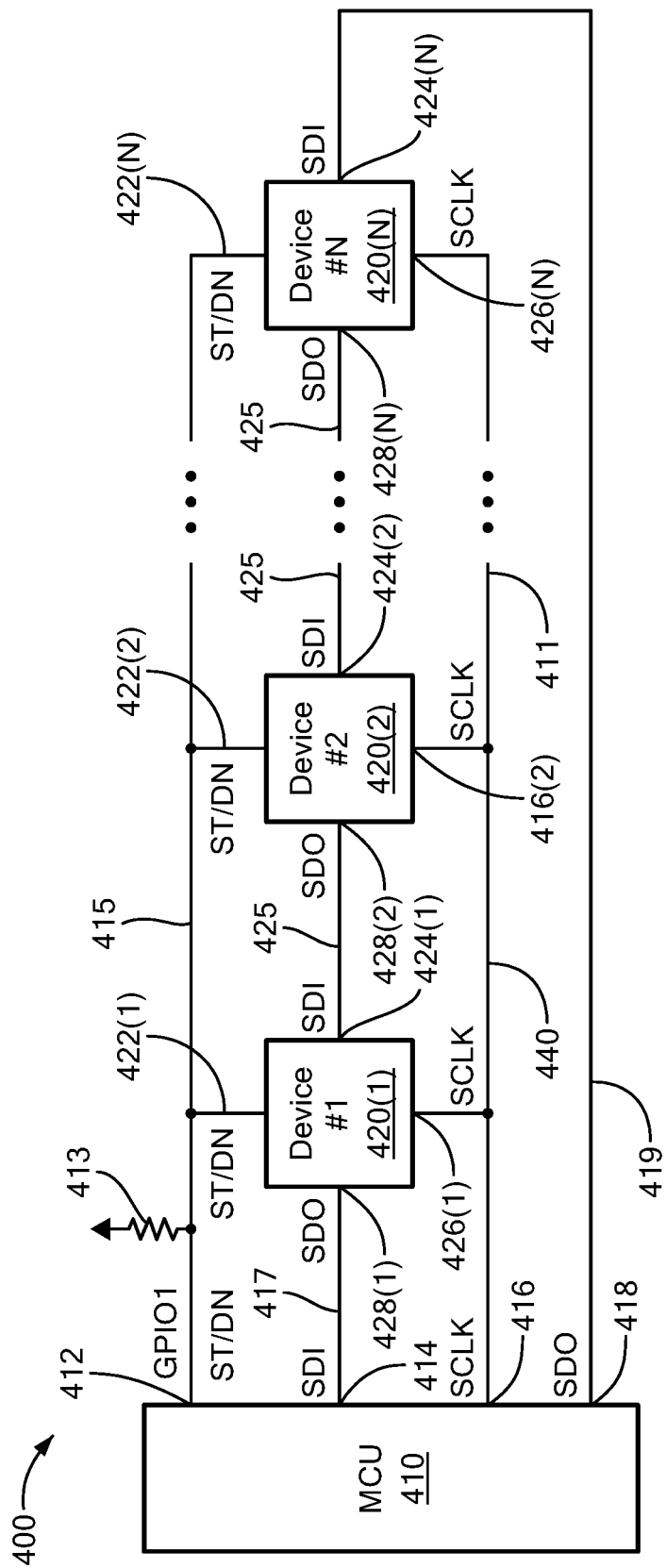
FIG. 4 is a block diagram of an example one-dimensional (1D) sensor array, in accordance with the present disclosure.

FIG. 4 is a block diagram of an example one-dimensional (1D) sensor array 400, in accordance with the present disclosure. Sensory array 400 can include a controller (e.g., microcontroller unit or "MCU") 410 and multiple sensor devices (e.g., sensor ICs) 420(1)-(N). In example embodiments, the sensor devices 420(1)-(N) can be configured in a serial daisy-chain configuration, as shown. Sensor array 400 may be configured for manual and/or automatic polling of the sensor devices 420(1)-(N) for data readback to controller 410.

The controller 410 can include an ST/DN pin 412, a serial-data-in (SDI) pin 414, an SCLK pin 416, and a serial-data-out (SDO) pin 418. The controller ST/DN pin 412 can include or be configured from a chip-select (nCS) and/or GPIO pin, in some examples. Each sensor device 420 can have a ST/DN pin 422, an SDI pin 424, a clock (SCLK) pin 426, and an SDO pin 428. The controller ST/DN pin 412 can be connected to the ST/DN pin 422 of each device 420 by ST/DN line 415, as shown. A pullup resister 413 may be present, as shown, e.g., to bias ST/DN line 415 to a high-impedance ("high") state. The SDO pin 428 of one sensor device, e.g., sensor device 420(1) (the sensor device closest to the controller 410 along the sensor data flow path) can be connected to the SDI pin 414 of the controller 410 by serial data line 417, as shown. The SDI pin 424 and SDO pin 428 of adjacent sensor devices can be connected by serial data lines 425, as shown. The SDI pin 424 of one sensor device, e.g., sensor device 420(N) (the sensor device furthest from the controller 410 along the sensor data flow path) can be connected to the SDI pin 418 of controller 410, e.g., for initially configuring the sensor array in a rapid serial data out (SDO) mode of operation. As noted previously, one or more of the sensor devices may include an internal timer, e.g., for waking the device for automatic measurement and/or polling.

Figure 5:
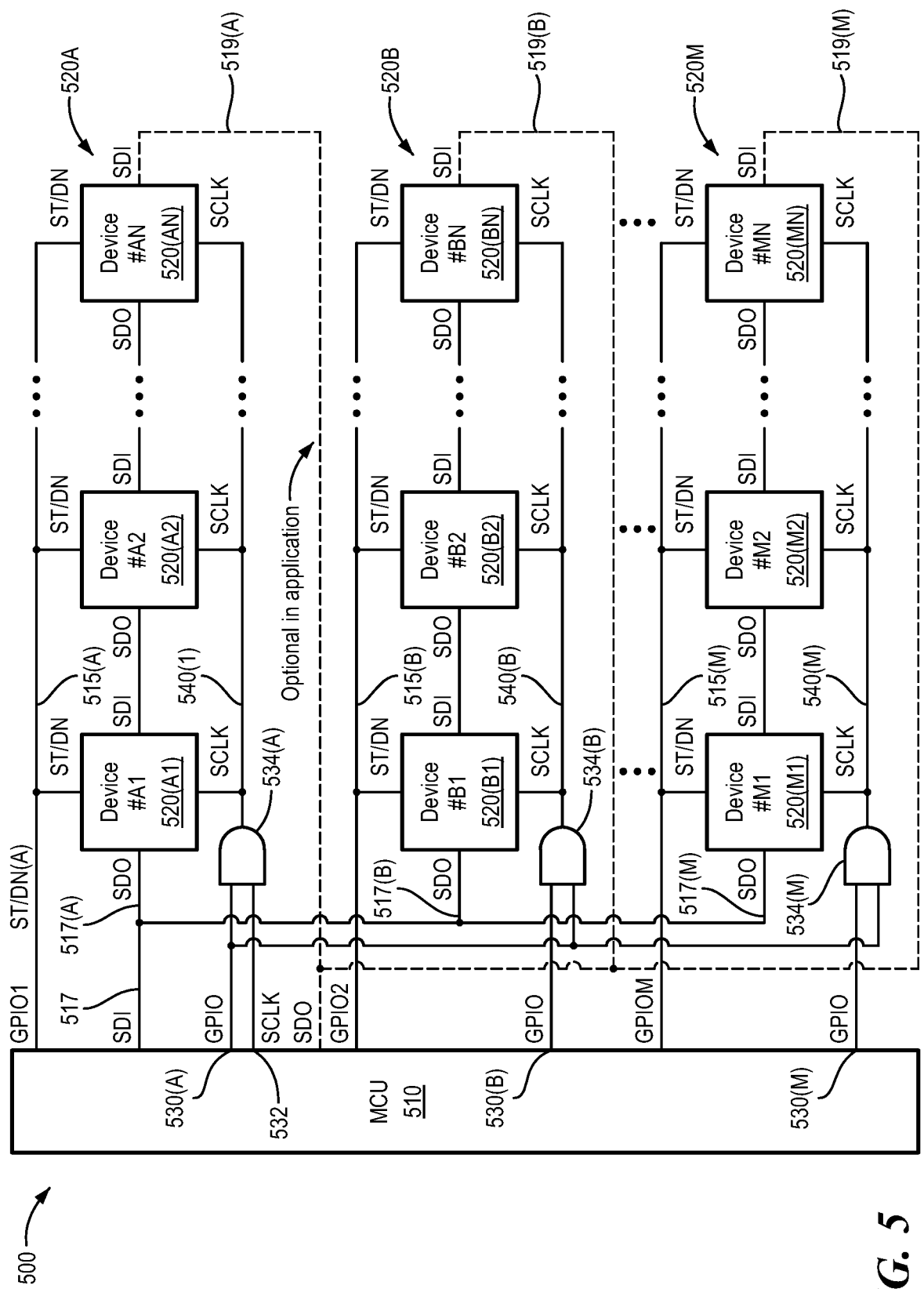
FIG. 5 is a block diagram of an example two-dimensional (2D) sensor array, in accordance with the present disclosure.

FIG. 5 is a block diagram of an example two-dimensional (2D) sensor array 500, in accordance with the present disclosure. Sensor array 500 includes controller 510 and a plurality of 1D sensor arrays 520A, 520B, . . . , 520M, each having a plurality of sensor devices 520(1)-(N). As shown, each 1D sensor array can have a daisy chain configuration and can be connected to controller 510 by an ST/DN line 515, and a system clock line (SCLK) 540, similar to as described for 1D sensor array 400 of FIG. 4. For data transfer to the controller 510, each 1D sensor array can have an SDO pin of one of its sensor ICs connected to an SDI port of the controller 510, as shown by serial lines 517 (shown as common to all 1D arrays) and 517(A)-(M). Each 1D array can (optionally) be connected to an SDO pin of controller 510 by a serial data line 519 connected to an SDI pin of one sensor of the array, e.g., for configuration of the sensors into an SDO mode of operation.

Controller 510 can include a GPIO pin 530 (or equivalent) for selectively providing clock signals to each 1D sensor array, respectively. Using the GPIO pin for a particular 1D sensor array and a corresponding logic element (AND gate) 534, controller 510 can supply a clock signal to the particular 1D sensor array 520A, 520B, . . . , 520M for reading data stored in the sensors (in internal output registers) of the 1D sensor array. An example of a timing diagram for a 2D sensor array similar to array 500 is described below and shown in FIG. 8.

Figure 6:
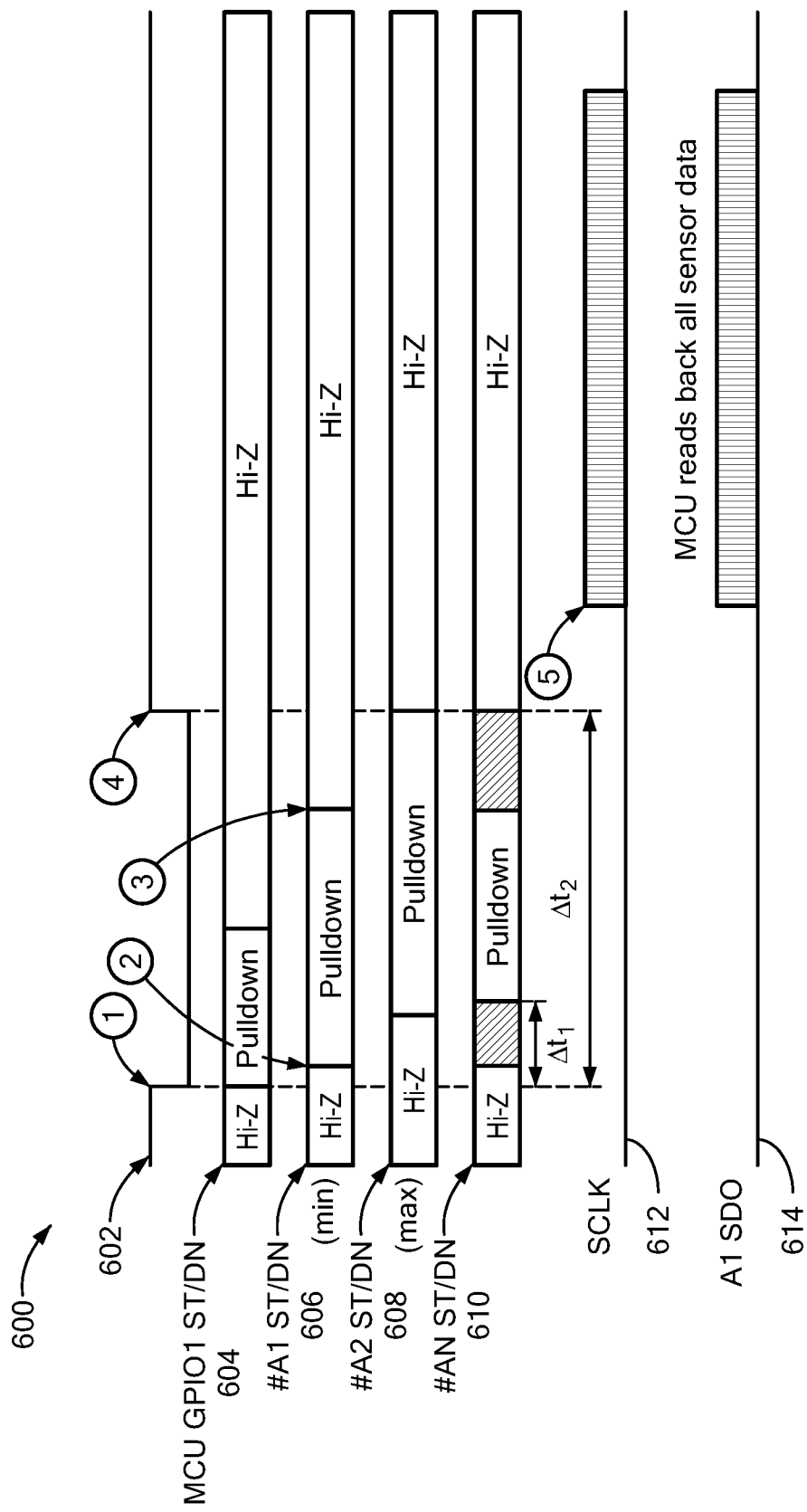
FIG. 6 is a timing diagram for an example sensor array utilizing microcontroller-initiated sensor polling, in accordance with the present disclosure.

FIG. 6 is a timing diagram 600 for an example sensor array utilizing controller-initiated sensor polling, in accordance with the present disclosure. FIG. 6 includes a timing diagram similar to the timing diagram of FIG. 3A (showing a single sensor device) but for a 1D sensor array having a plurality of sensor ICs (sensor devices). The sensor array may be similar to 1D sensor array 400, shown and described above for FIG. 4, as configured for controller-initiated polling of the array sensor devices.

In FIG. 6, the state of the sensor array ST/DN line is shown at 602. The state of the controller ST/DN pin is shown at 604. The state of the ST/DN pins of sensor devices A1, A2, AN are shown at 604, 606, and 608, respectively. The state of the system clock (SCLK) line is shown at 610 while the state of the serial data line between the SDI pin of the controller and the SDO pin of the sensor device providing data (shown as A1), e.g., the closest sensor device to the controller on the serial data flow path, is shown at 612. Events 1-5 are shown indicating certain events of the controller-initiated polling, as described in further detail below.

For the example of controller-initiated polling shown, the controller initiates the process by pulling down on its ST/DN pin 604, which simultaneously pulls down the connected ST/DN line 602 (event 1). The ST/DN line is also connected to each of the sensor devices A1-AN in the 1D array. The pull down on the ST/DN line 602 acts as a trigger or command for each sensor device A1-AN to perform a sensor measurement (and to wake from the sleep mode if initially in that mode). In response, each sensor device A1-AN of the array will pull down on the ST/DN line 602 by pulling its own ST/DN pin (606, 608, 610) low and then commence performing a sensor measurement. Sensor device A1 is shown as the first sensor device to initiate a pulldown on the ST/DN line 602, at event 2, followed by sensors A2 and AN.

After each sensor device A1-AN completes its measurement using its internal transducer/sensor, the sensor device releases its pulldown on the ST/DN line, as shown for sensor A1 at event 3. The ST/DN line 602 is held low until all sensor devices A1-AN of the 1D array have completed their respective measurements and the last ST/DN pulldown is released, as shown for sensor device A2 at event 4. When all sensor devices A1-AN have released the ST/DN line 602, the line 602 transitions to a high state, as shown at event 4. The transition of the ST/DN line 602 from a low state to a high state (event 4) signals the controller to apply a clock signal via the SCLK line 612 to the sensor devices A1-AN to read back data from each sensor device (stored in the internal output register), as indicated at event 5.

Even though the pull down (event 1) on the ST/DN line 602 will affect the sensor devices A1-AN as a group at essentially the same time, the sensor devices A1-AN may exhibit timing differences in their respective wake and measurement actions, e.g., due to dimensional, process and/or signal propagation variances, etc. As a result, the respective start and stop times may vary among the sensor devices A1-AN of the 1D array. Time delay $\Delta T_1$ is shown representing the delay between the time the system controller first pulls down on the ST/DN line 602 and the time the last sensor device (shown as AN) pulls down on the ST/DN line 602 in response. Time delay $\Delta T_2$ is shown representing the delay between the time the system controller first pulls down on the ST/DN line 602 and the time the last sensor device (shown as A2) releases its pull down on the ST/DN line 602. The time delays $\Delta T_1$ and $\Delta T_2$ can vary between different sensor devices and/or applications. The time each sensor device pulls down on the ST/DN line 602 can also vary among the sensor devices A1-AN, as shown.

Figure 7:
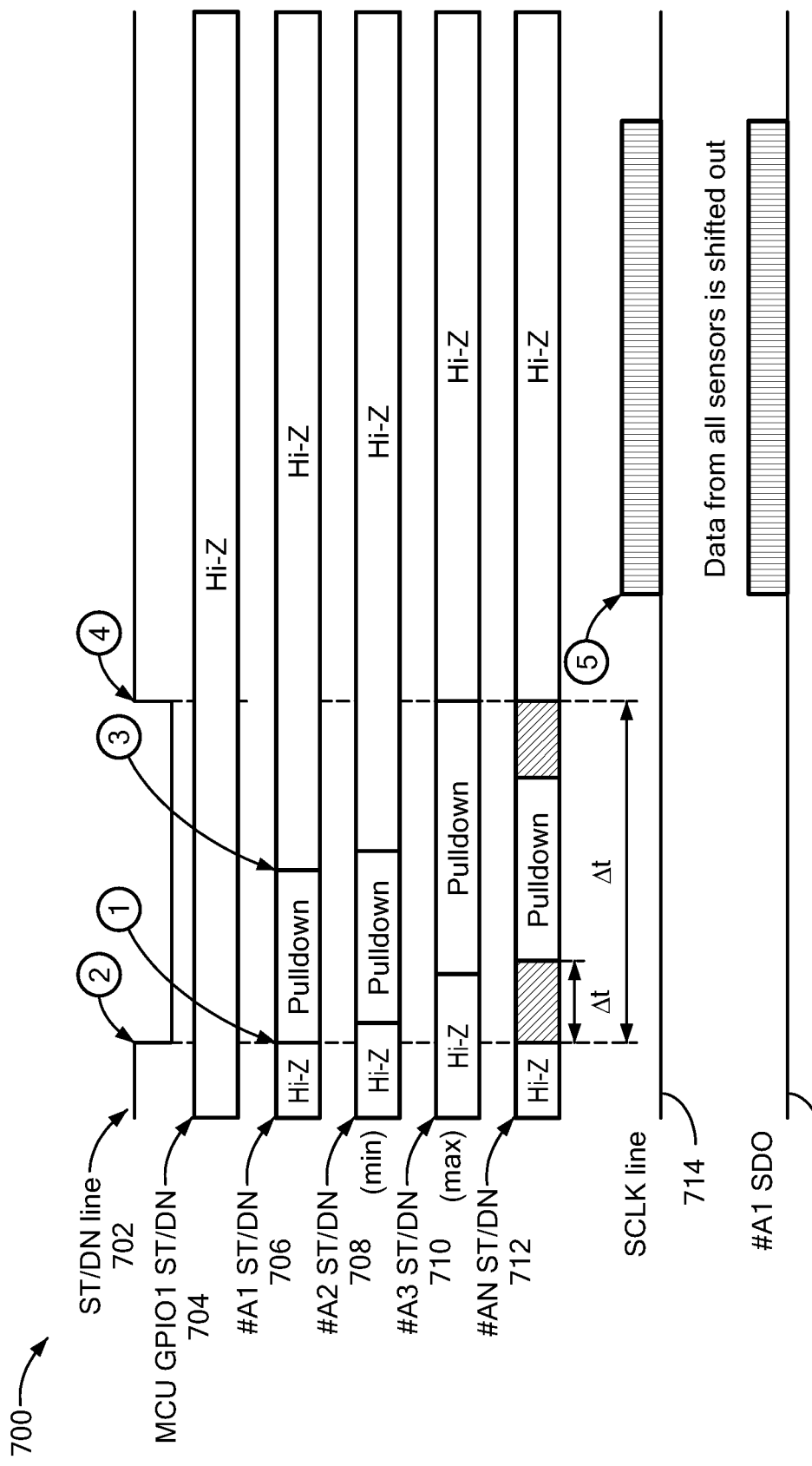
FIG. 7 is a timing diagram for an example sensor array utilizing microcontroller-initiated sensor polling, in accordance with the present disclosure.

FIG. 7 is a timing diagram 700 for an example sensor array utilizing automatic sensor polling, in accordance with the present disclosure. FIG. 7 shows a timing diagram similar to the timing diagram of FIG. 3B but for a 1D sensor array having a plurality of sensor devices A1-AN. The 1D sensor array may be similar to 1D sensor array 400, shown and described above for FIG. 4, as configured for automatic or sensor-initiated polling of the sensor devices.

In FIG. 7, the state of the sensor array ST/DN line is shown at 702. The state of the controller ST/DN pin is shown at 704. The state of the ST/DN pins of sensor devices A1, A2, A3, AN, are shown at 706, 708, 710, and 712, respectively. The state on the system clock (SCLK) line is shown at 714 while the state of the serial data line between an SDI pin of the controller and a SDO pin of the closest sensor device (shown as A1) to on the serial data flow path to the controller is shown at 716. Events 1-5 are shown indicating certain events of the automatic polling, as described in further detail below.

For an automatic polling configuration of a 1D array, all sensors in the array can be commanded or triggered by the actions of one "triggering" sensor device to simultaneously perform a measurement. Whenever any sensor device in the array pulls down on the common ST/DN line (connected to all of the sensor devices), the transition of the ST/DN line 702 to the low state also pulls the ST/DN pin of each sensor device to the low state. For example, sensor device A1 is shown initiating a pulldown on its own ST/DN pin 706, as shown at event 1. In response, the ST/DN line 702 is pulled low, as shown at event 2. In response to the ST/DN line being pulled low, all of the other sensor devices (A2, A3 . . . , AN) pull down on the ST/DN line 702, by pulling down their ST/DN pins 708, 710, and 712, respectively. The low state on the ST/DN pin triggers each sensor device A1-AN to begin a sensor measurement (and to wake if initially in a sleep state).

After each sensor device A1-AN completes its measurement using its internal sensor, the sensor device releases its pulldown on the ST/DN line 702, at which time the sensor data will be ready for storage in the internal shift register of the sensor device for transfer to the controller. Sensor device A1 is as shown as having released the ST/DN line 702 at event 3. The ST/DN line 702 is held low, however, until all sensors on the sensor chain (array) have completed their measurement and the last ST/DN pulldown (shown as ST/DN pin 708 for device A3) is released, as shown at event 4. The transition of the ST/DN line 702 from a low state to a high state (event 4) signals the controller to apply a clock signal on SCLK line 714 to the sensor devices in the sensor array to read back data, as shown at event 5. A rising edge on the ST/DN line 702 can also be used as a command/trigger for each sensor to store the resultant data into its output shift register and begin low-power sleep mode entry.

As noted previously, sensor devices A1-AN will have timing differences in their respective wake and measurement actions, so the respective start and stop times will vary among the sensor devices A1-AN, as indicated. Time delay $\Delta T_1$ is shown representing the delay between the time the ST/DN line 702 is pulled low by the triggering sensor device (A1) and the time the last sensor device (shown as AN) pulls down on the ST/DN line 702 in response. Time delay $\Delta T_2$ is shown representing the delay between the time the ST/DN line 702 is first pulled low and the time the last sensor device (shown as A3) releases its pull down on the ST/DN line 702. The time delays $\Delta T_1$ and $\Delta T_2$ can vary between different sensor devices and/or applications.

Since each sensor device in a 1D sensor array (sensor chain) will have some power-on and conversion time before it has completed its measurement, examples and embodiments of the present disclosure include 2D or 3D sensor arrays that can utilize time multiplexing for data readback and measurement between 1D sub-arrays in the multi-dimensional sensor array. Time multiplexing can allow one sub-array to be commanded to begin taking sensor measurements while data is being read back from another sub-array. Using time multiplexing, a sensor array can accordingly be optimized to minimize scan time and/or power consumption.

Figure 8:
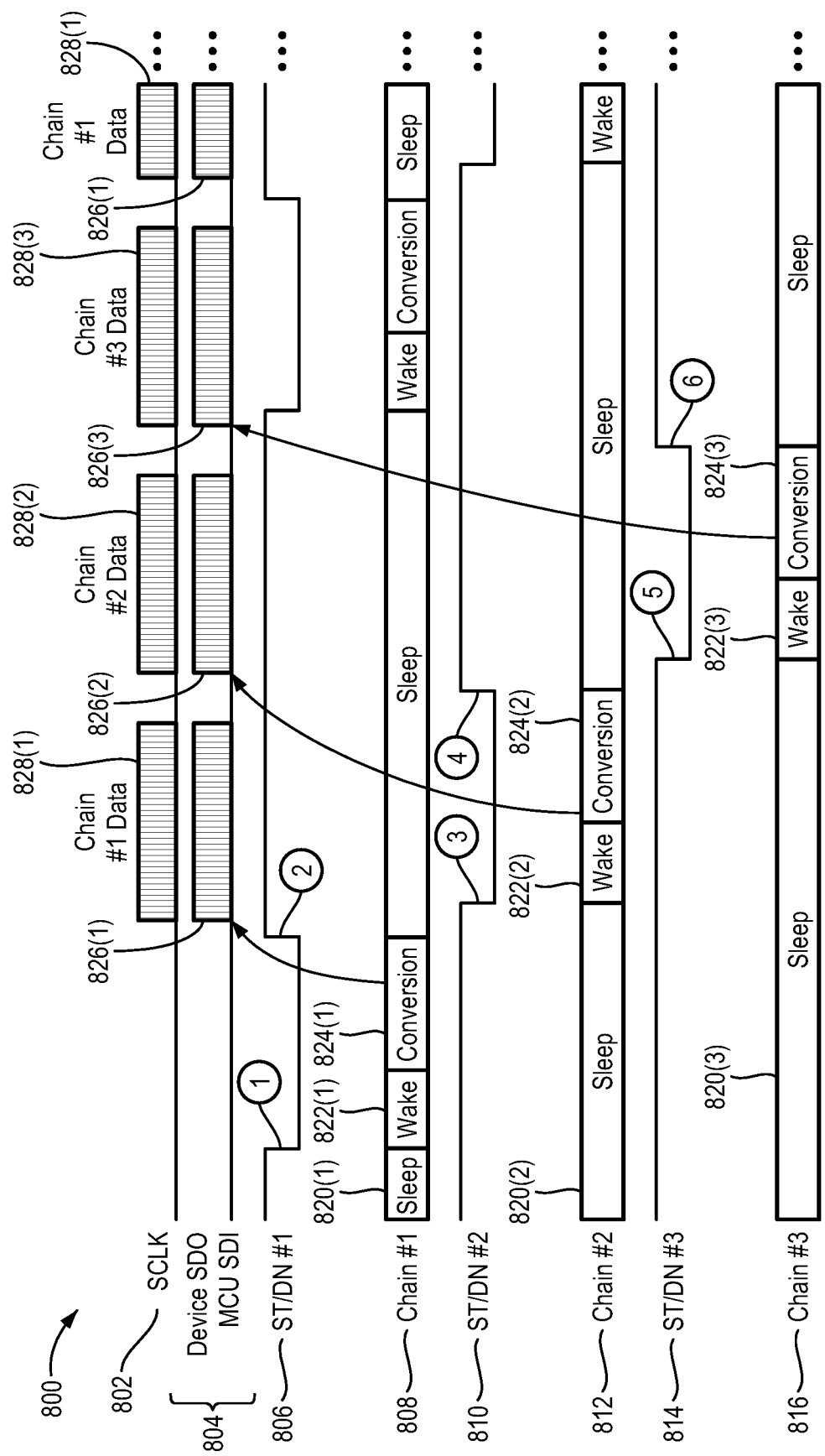
FIG. 8 is a timing diagram illustrating time-multiplexing of data readback for an example 2D sensor array having three chains of sensor devices, in accordance with the present disclosure.

FIG. 8 is a timing diagram 800 illustrating time-multiplexing of data readback for an example 2D sensor array having three chains of sensor devices (1D arrays), in accordance with the present disclosure. The sensor array may be similar to sensor array 500 of FIG. 5 but with three 1D sensor arrays, i.e., sensor chains 1-3, acting as sub-arrays. States corresponding to the SCLK line and controller-sensor array data (device SDO/MCU SDI) line are shown at 802 and 804, respectively. States for the ST/DN line for each of sensor chains 1-3 are shown at 806, 810, and 814, respectively. States (sleep, wake, data conversion) for sensor chains 1-3 are shown at 808, 812, and 816, respectively. For sensor chain 1, sleep, wake, and data conversion states are shown as 820(1), 822(1), and 824(1), respectively. For sensor chain 2, sleep, wake, and conversion (data) states are shown as 820(2), 822(2), and 824(2), respectively. For sensor chain 3, sleep, wake, and conversion (data) states are shown as 820(3), 822(3), and 824(3), respectively. Transfer of data from sensor chains 1-3 to the SDI pin of the controller is indicated by arrows to the device SDO/MCU SDI line 804.

For the configuration shown, one chain in the 2D sensor array can be commanded to begin a measurement while data from another sensor chain is being read back to the controller. As shown by ST/DN line 806, sensor chain 1 is initially in a sleep state 820(1). The ST/DN line 806 for sensor chain 1 is pulled down (e.g., by a command from the controller or a pull down from an automatic waking sensor device in the A1 sensor chain), as shown by event 1. All of the sensor devices in sensor chain 1 then enter an active or wake state 822(1) and subsequently take sensor measurements 824(1), the data from which are converted to corresponding digital words, also indicated by 824(1). When finished with sensor measurement, the sensor devices release the ST/DN line 806, at event 2, which triggers transfer of the measurement data to the serial data line 804 and to the controller. Next, a similar process occurs for sensor chain 2 and then for sensor chain 3 (the order of which chain is next may be reversed). The process for all of the sensor chains can be repeated, as indicated. Accordingly, by time-multiplexing the operation of each sensor sub-array (1D sensor array or sensor chain), the sensor array (system) can be optimized to minimize scan time and/or power consumption.

Figure 9:
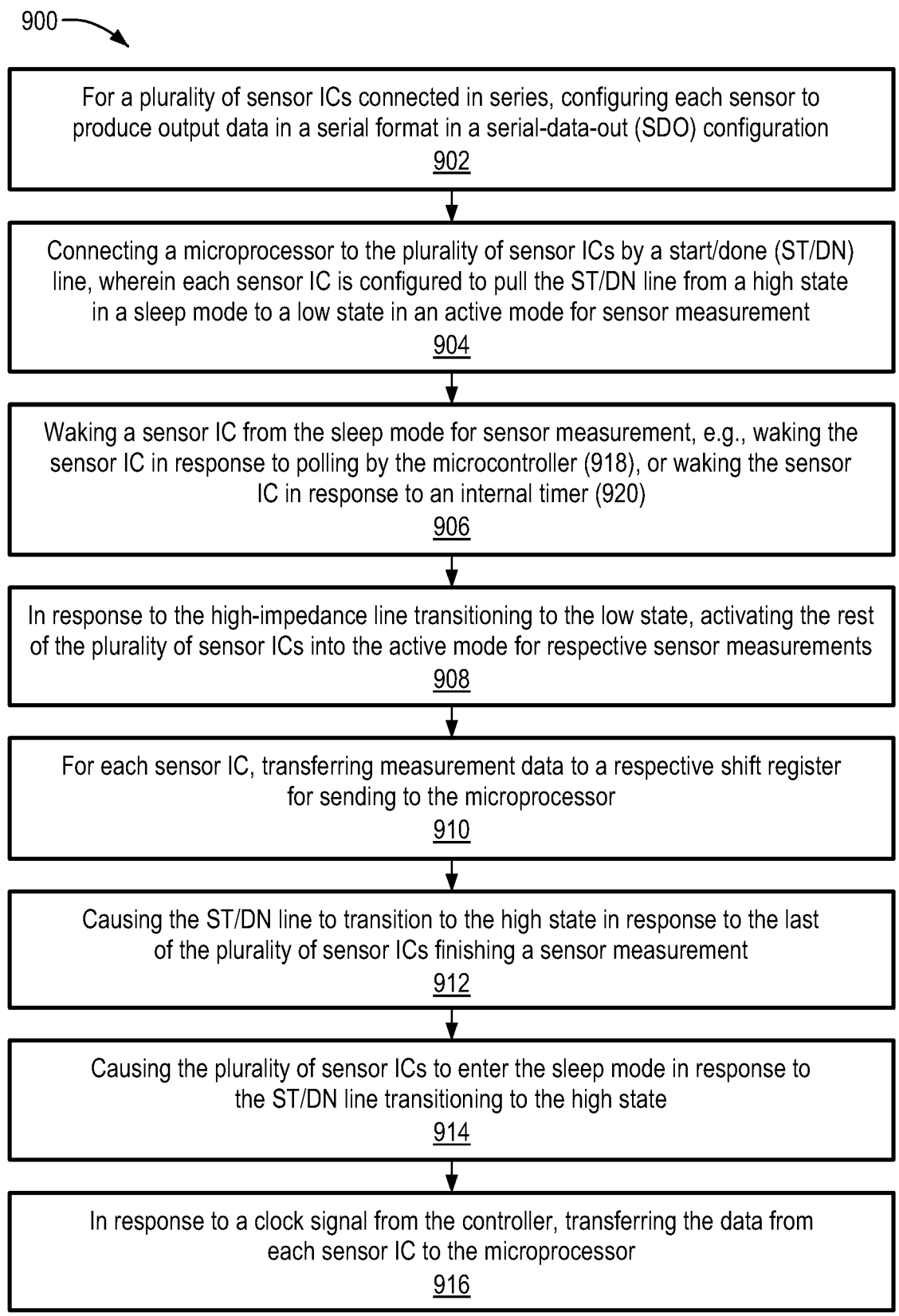
FIG. 9 is a block diagram of an example method of rapid serial data transfer for a sensor array, in accordance with the present disclosure.

FIG. 9 is a block diagram of an example method of rapid serial data transfer 900 for a sensor array, in accordance with the present disclosure. Method 900 can include, for a plurality of sensor ICs connected in series, configuring each sensor to produce output data in a serial format in a serial-data-out (SDO) configuration, as described at 902. Connecting a microprocessor to the plurality of sensor ICs by a start/done (ST/DN) line, wherein each sensor IC is configured to pull the ST/DN line from a high state in a sleep mode to a low state in an active mode for sensor measurement, as described at 904. Method 900 can include waking a sensor IC from the sleep mode for sensor measurement, as described at 906, e.g., waking the sensor IC in response to polling by the microcontroller (918), or waking the sensor IC in response to an internal timer (920). In response to the high-impedance line transitioning to the low state, the method 900 can include activating the rest of the plurality of sensor ICs into the active mode for respective sensor measurements, as described at 908.

For each sensor IC, transferring measurement data to its internal shift register for sending to the microprocessor, as described at 910. Method 900 can include causing the ST/DN line to transition to the high state in response to the last of the plurality of sensor ICs finishing a sensor measurement, as described at 912. Method 900 can further include causing the plurality of sensor ICs to enter the sleep mode in response to the ST/DN line transitioning to the high state, as described at 914. In response to a clock signal from the controller, method 900 can include transferring the data from each sensor IC to the microprocessor, as described at 916.

Figure 10:
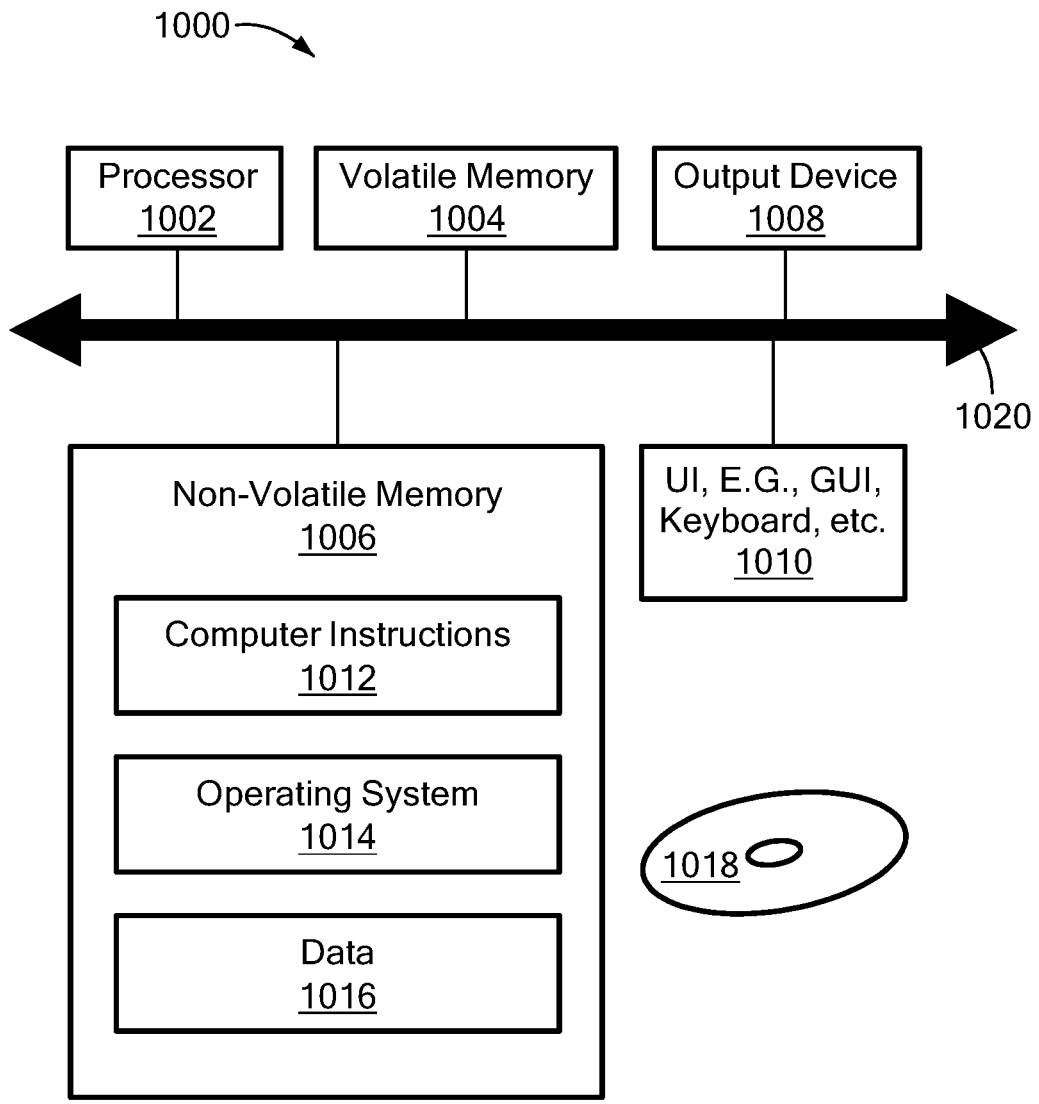
FIG. 10 is a block diagram of an example computer system operative to perform processing, in accordance with the present disclosure.

FIG. 10 is a block diagram of an example computer system 1000 operative to perform processing, in accordance with the present disclosure. Computer system 1000 can perform all or at least a portion of the processing, e.g., steps in the algorithms and methods, described herein. The computer system 1000 includes a processor 1002, a volatile memory 1004, a non-volatile memory 1006 (e.g., hard disk, EEPROM, OTP memory, etc.), an output device 1008 and a user input or interface (UI) 1010, e.g., graphical user interface (GUI), a mouse, a keyboard, a display, and/or any common user interface, etc. The non-volatile memory (non-transitory storage medium) 1006 stores computer instructions 1012 (a.k.a., machine-readable instructions or computer-readable instructions) such as software (computer program product), an operating system 1014 and data 1016. In one example, the computer instructions 1012 are executed by the processor 1002 out of (from) volatile memory 1004. In one embodiment, an article 1018 (e.g., a storage device or medium such as a hard disk, an optical disc, magnetic storage tape, optical storage tape, flash drive, etc.) includes or stores the non-transitory computer-readable instructions. Bus 1020 is also shown.

Processing may be implemented in hardware, software, or a combination of the two. Processing may be implemented in computer programs (e.g., one or more software applications) executed on programmable computers/machines that each includes a processor, a storage medium or other article of manufacture that is readable by the processor (including volatile and non-volatile memory and/or storage elements), and optionally at least one input device, and one or more output devices. Program code may be applied to data entered using an input device or input connection (e.g., a port or bus) to perform processing and to generate output information.

The system 1000 can perform processing, at least in part, via a computer program product or software application, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate. Further, the terms "computer" or "computer system" may include reference to plural like terms, unless expressly stated otherwise.

Processing may be performed by one or more programmable processors executing one or more computer programs to perform the functions of the system. All or part of the system may be implemented as, special purpose logic circuitry, e.g., an FPGA (field programmable gate array) and/or an ASIC (application-specific integrated circuit). In some examples, digital logic circuitry, e.g., one or more FPGAs, can be operative as a processor as described herein. Accordingly, aspects, examples, and/or embodiments of the inventive subject matter can afford various benefits relative to prior art techniques. For example, embodiments and examples of the present disclosure can enable or facilitate e.g., combining use of sensor interrupts to a microcontroller with an architecture to trigger other sensors (sensor ICs or sensor devices) in a grouping in order to quickly gather sensor data. Once data is available, a serial interface allows rapid serial data output (SDO) to the system controller. Embodiments and examples of the present disclosure can enable or facilitate e.g., a method/structure/circuitry to stream data from a sensor to a microcontroller without requiring the overhead of addressing or multiple chip-select lines. Moreover, embodiments and examples of the present disclosure can enable or facilitate e.g., replacing "scanning" techniques in multi-sensor systems, with a sensor interrupt solution that can allow for simpler system hardware and firmware in order to determine the state (e.g., read measurement data from) of a large number of sensors.

Various embodiments of the concepts, systems, devices, structures, and techniques sought to be protected are described above with reference to the related drawings. Alternative embodiments can be devised without departing from the scope of the concepts, systems, devices, structures, and techniques described. For example, while certain flip-flops have been referenced above and/or in the drawings, e.g., set-reset (S-R) flip-flops, the scope of the present disclosure includes use of other types of flip-flops (latches), e.g., examples/embodiments can include JK flip-flops, data (D) flip-flops, and/or toggle (T) flip-flops with suitable connections.

It is noted that various connections and positional relationships (e.g., over, below, adjacent, etc.) may be used to describe elements and components in the description and drawings. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship.

As an example of an indirect positional relationship, positioning element "A" over element "B" can include situations in which one or more intermediate elements (e.g., element "C") is between elements "A" and elements "B" as long as the relevant characteristics and functionalities of elements "A" and "B" are not substantially changed by the intermediate element(s).

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture, or an article, that includes a list of elements is not necessarily limited to only those elements but can include other elements not expressly listed or inherent to such apparatus, method, composition, mixture, or article.

Additionally, the term "exemplary" means "serving as an example, instance, or illustration. Any embodiment or design described as "exemplary" is not necessarily to be construed as preferred or advantageous over other embodiments or designs. The terms "one or more" and "at least one" indicate any integer number greater than or equal to one, i.e., one, two, three, four, etc. The term "plurality" indicates any integer number greater than one. The term "connection" can include an indirect "connection" and a direct "connection".

References in the specification to "embodiments," "one embodiment," "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it may affect such feature, structure, or characteristic in other embodiments whether explicitly described or not.

Relative or positional terms including, but not limited to, the terms "upper," "lower," "right," "left," "vertical," "horizontal," "top," "bottom," and derivatives of those terms relate to the described structures and methods as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another, or a temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within plus or minus (±) 10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

The disclosed subject matter is not limited in its application to the details of construction and to the arrangements of the components set forth in the following description or illustrated in the drawings. The disclosed subject matter is capable of other embodiments and of being practiced and carried out in various ways.

Also, the phraseology and terminology used in this patent are for the purpose of description and should not be regarded as limiting. As such, the conception upon which this disclosure is based may readily be utilized as a basis for the designing of other structures, methods, and systems for carrying out the several purposes of the disclosed subject matter. Therefore, the claims should be regarded as including such equivalent constructions as far as they do not depart from the spirit and scope of the disclosed subject matter.

Although the disclosed subject matter has been described and illustrated in the foregoing exemplary embodiments, the present disclosure has been made only by way of example. Thus, numerous changes in the details of implementation of the disclosed subject matter may be made without departing from the spirit and scope of the disclosed subject matter.

Accordingly, the scope of this patent should not be limited to the described implementations but rather should be limited only by the spirit and scope of the following claims.

All publications and references cited in this patent are expressly incorporated by reference in their entirety.

What is claimed is:

1. A rapid-data-transfer sensor array comprising:
   a. a controller configured to receive serial data; and
   b. a first plurality of sensor integrated circuits (ICs) connected in series and configured to periodically take measurements and provide measurement data to the controller as serial data, each sensor IC including a transducer, a shift register, a serial-data-in (SDI) pin, a serial-data-out (SDO) pin, a bi-directional start/done (ST/DN) pin, a power regulation circuit configured to selectively supply power for a sleep mode and an active mode, and a clock pin for receiving a clock signal from the controller;
   c. wherein each sensor IC is configured for operation in the sleep mode in which the transducer is inactive and the active mode in which a measurement is performed with the transducer, wherein the bi-directional ST/DN pin is configured to activate the sensor IC from the sleep mode in which the ST/DN pin is in a high state into the active mode in which the ST/DN pin is in a low state for the measurement, wherein the sensor IC is configured to pull the bi-directional ST/DN pin to the low state when performing the measurement and to release the bi-directional ST/DN pin and enter the sleep mode after finishing the measurement, and wherein, when finished with the measurement, the sensor IC is configured to provide measurement data to the shift register for transfer to the controller; and
   d. wherein the controller is configured to provide a clock signal on the clock pin to initiate serial transfer of data from each of the shift registers of the first plurality of sensor ICs to the respective SDO pins for data transfer to the controller.

2. The sensor array of claim 1, wherein the controller is connected to the bi-directional ST/DN pin of each of the first plurality of sensor ICs by a first ST/DN line configured with a pull-up resistor.

3. The sensor array of claim 2, wherein the first ST/DN line is connected to a general-purpose input/output (GPIO) pin of the controller, wherein the GPIO pin is configured as either an output pin pulling low or an input pin.

4. The sensor array of claim 1, wherein in the sleep mode, for each sensor IC the shift register is active.

5. The sensor array of claim 1, wherein each of the sensor ICs incudes an internal pull-down open drain switch configured to pull the bi-directional ST/DN pin to the low state while the sensor IC is in the active mode.

6. The sensor array of claim 1, wherein the sensor ICs are connected in a serial daisy chain configuration.

7. The sensor array of claim 1, wherein each sensor IC is configured to store measurement data in the shift register in response to a transition on the ST/DN pin from the low state to the high state.

8. The sensor array of claim 1, wherein each sensor IC is configured to receive serial data provided at the SDI pin and, when a clock signal is received on the clock line from the controller, store the data in the shift register.

9. The sensor array of claim 1, wherein the power regulation circuit of each sensor IC includes an internal timer configured to wake from the sleep mode based on a timing provided by the timer.

10. The sensor array of claim 9, wherein the timer is programmable.

11. The sensor array of claim 1, wherein the first plurality of sensor ICs comprises one or more magnetic field sensors.

12. The sensor array of claim 11, wherein the one or more magnetic field sensors comprise one or more Hall effect elements.

13. The sensor array of claim 11, wherein the one or more magnetic field sensors comprise one or more magnetoresistance elements.

14. The sensor array of claim 1, wherein the first plurality of sensor ICs comprises one or more temperature sensors.

15. The sensor array of claim 1, wherein the first plurality of sensor ICs comprises one or more current sensors.

16. The sensor array of claim 1, wherein the first plurality of sensor ICs comprises one or more voltage sensors.

17. The sensor array of claim 1, wherein the first plurality of sensor ICs comprises one or more analog-to-digital converters (ADCs), wherein each ADC is coupled to a transducer disposed exterior to the respective sensor IC.

18. The sensor array of claim 1, further comprising a second plurality of sensor ICs connected in series and configured to periodically take measurements and provide measurement data to the controller as serial data, each sensor IC including a transducer, a shift register a serial-data-in (SDI) pin, a serial-data-out (SDO) pin, a bi-directional ST/DN pin, a power regulation circuit configured to selectively supply power for a sleep mode and an active mode, and a clock pin for receiving a clock signal from the controller, wherein the controller is configured to provide a clock signal on the clock pin to initiate serial transfer of data from each of the shift registers of the second plurality of sensor ICs.

19. The sensor array of claim 18, wherein the controller is connected to the bi-directional ST/DN pin of each of the second plurality of sensor ICs by a second ST/DN line configured with a pull-up resistor.

20. The sensor array of claim 1, wherein the controller is configured to activate one of the sensor ICs from the sleep mode to the active mode by sending a polling signal on the ST/DN line.

21. The sensor array of claim 1, wherein each sensor IC is further configured to, when a sensor measurement threshold is exceeded, to pull the ST/DN pin to the low state for a fixed amount of time before releasing the ST/DN pin and entering the sleep mode.

22. The sensor array of claim 1, wherein the controller comprises a microcontroller.

23. The sensor array of claim 1, wherein the controller comprises a digital signal processor (DSP).

24. The sensor array of claim 1, wherein the controller comprises a field programmable gate array (FPGA).

25. The sensor array of claim 1, wherein each of the first plurality of IC sensors is configured to receive serial data on the SDI pin from a connected IC sensor.

26. A method of collecting data from a rapid data transfer sensor array, the method comprising:
   a. configuring a plurality of sensor integrated circuits (ICs) to produce output data in a serial format in a serial-data-out (SDO) configuration, wherein the plurality of sensor ICs are connected in series;
   b. connecting a start/done (ST/DN) line from a controller to the plurality of sensor ICs, wherein each sensor IC is configured to pull the ST/DN line from a high state in a sleep mode to a low state in an active mode for sensor measurement;
   c. waking a first sensor IC from a sleep mode to the active mode for sensor measurement, wherein the ST/DN line is pulled to the low state when the sensor IC is in the active mode;
   d. performing a sensor measurement with the first sensor IC in the active mode, wherein the first sensor releases the ST/DN line from the low state when the sensor measurement is finished;
   e. in response to completion of the sensor measurement by the first sensor IC, transferring measurement data to a shift register of the first sensor IC and transitioning the first sensor IC to the sleep mode;
   f. in response to the ST/DN line being pulled to the low state, activating the rest of plurality of sensor ICs into the active mode for respective sensor measurements;
   g. in response to completion of the respective sensor measurements of the rest of the plurality of sensor ICs, transferring measurement data to respective shift registers of the sensor ICs and transitioning the rest of sensor ICs to the sleep mode;
   h. causing the ST/DN line to transition to the high state in response to the last of the plurality of sensor ICs finishing the respective sensor measurement and releasing the ST/DN line from the low state;
   i. in response to the ST/DN line transitioning to the high state, the controller sending a clock signal to the plurality of sensor ICs to initiate data transfer; and
   j. in response to the plurality of sensor ICs receiving the clock signal, transferring data in serial format from the shift registers of the plurality of sensor ICs to the controller.

27. The method of claim 26, wherein the data is transferred while the plurality of sensor ICs is in the sleep mode.

28. The method of claim 26, wherein the plurality of sensor ICs comprises magnetic field sensing elements.

29. The method of claim 28, wherein the magnetic field sensing elements comprises one or more Hall effect elements.

30. The method of claim 28, wherein the magnetic field sensing elements comprises one or more magnetoresistance elements.

31. The method of claim 26, wherein the plurality of sensor ICs comprises one or more temperature sensors.

32. The method of claim 26, wherein the plurality of sensor ICs comprises one or more current sensors.

33. The method of claim 26, wherein the plurality of sensor ICs comprises one or more voltage sensors.

34. The method of claim 26, wherein the plurality of sensor ICs comprises one or more analog-to-digital converters (ADC), wherein each ADC is coupled to a transducer disposed exterior to the respective sensor IC.

35. The method of claim 26, wherein waking a first sensor IC from a sleep mode to the active mode comprises the controller pulling the ST/DN line to the low state.

36. The method of claim 26, wherein waking a first sensor IC from a sleep mode to the active mode comprises an activation of the sensor IC by an internal timer.

37. A rapid-data-transfer sensor array comprising:
   a. a first plurality of sensor integrated circuits (ICs) connected in series and configured to periodically take measurements and provide measurement data to a data line as serial data, each sensor IC including a transducer, a shift register, a serial-data-in (SDI) pin, a serial-data-out (SDO) pin, a bi-directional start/done (ST/DN) pin, a power regulation circuit configured to selectively supply power for a sleep mode and an active mode, and a clock pin for receiving a clock signal from a clock line;
   b. wherein each sensor IC is configured for operation in the sleep mode in which the transducer is unused and the active mode in which a measurement is performed with the transducer, wherein the bi-directional ST/DN pin is configured to activate the sensor IC from the sleep mode in which the ST/DN pin is in a high state into the active mode in which the ST/DN pin is in a low state for the measurement, wherein the sensor IC is configured to pull the bi-directional ST/DN pin to the low state when performing the measurement and to release the bi-directional ST/DN pin and enter the sleep mode after finishing the measurement, and wherein, when finished with the measurement, the sensor IC is configured to provide measurement data to the shift register for transfer to the data line; and
   c. wherein the clock pin is configured to provide a clock signal to initiate serial transfer of data from each of the shift registers of the first plurality of sensor ICs to the respective SDO pins for data transfer to the data line.

38. The sensor array of claim 37, wherein the sensor ICs of the first plurality of sensor ICs are connected at the respective bi-directional ST/DN pin by a first ST/DN line configured with a pull-up resistor.

39. The sensor array of claim 37, wherein in the sleep mode, for each sensor IC the shift register is active.

40. The sensor array of claim 37, wherein each of the sensor ICs incudes an internal pull-down open drain switch configured to pull the bi-directional ST/DN pin to the low state while the sensor IC is in the active mode.

41. The sensor array of claim 37, wherein the sensor ICs are connected in a serial daisy chain configuration.

42. The sensor array of claim 37, wherein each sensor IC is configured to store measurement data in the shift register in response to a transition on the ST/DN pin from the low state to the high state.

43. The sensor array of claim 37, wherein each sensor IC is configured to receive serial data provided at the SDI pin and store the data in the shift register.

44. The sensor array of claim 37, wherein the power regulation circuit of each sensor IC includes an internal timer configured to wake from the sleep mode based on a timing provided by the timer.

45. The sensor array of claim 37, wherein the first plurality of sensor ICs is configured for connection to a microcontroller having a GPIO pin, a SDI pin, and a clock pin, wherein the microcontroller is configured to control the bi-directional ST/DN line with the GPIO pin, receive serial data at the SDI pin from the first plurality of sensor ICs over the data line, and to provide a clock signal to the first plurality of sensor ICs on the clock pin.

\* \* \* \* \*